(12) United States Patent  
Gilbert

(10) Patent No.: US 7,426,131 B2  
(45) Date of Patent: Sep. 16, 2008

(54) PROGRAMMABLE MEMORY DEVICE CIRCUIT

(75) Inventor: Nad Edward Gilbert, Higley, AZ (US)

(73) Assignee: Adesto Technologies, Sunnyvale, CA (US)

(*) Notice: Subject to any disclaimer, the term of this patent is extended or adjusted under 35 U.S.C. 154(b) by 28 days.

(21) Appl. No.: 11/555,560

(22) Filed: Nov. 1, 2006

(65) Prior Publication Data

US 2007/0121368 A1    May 31, 2007

Related U.S. Application Data

(60) Provisional application No. 60/732,298, filed on Nov. 1, 2005, provisional application No. 60/732,218, filed on Nov. 1, 2005, provisional application No. 60/732,217, filed on Nov. 1, 2005, provisional application No. 60/732,216, filed on Nov. 1, 2005.

(51) Int. Cl.  
*G11C 11/00* (2006.01)

(52) U.S. Cl. .................. 365/148; 365/204; 365/210.11

(58) Field of Classification Search .................. 365/148, 365/207, 210.11  
See application file for complete search history.

(56) References Cited

U.S. PATENT DOCUMENTS

| | | | |
|---|---|---|---|
| 6,597,598 B1* | 7/2003 | Tran et al. | 365/94 |
| 7,209,379 B2* | 4/2007 | Mori et al. | 365/148 |

* cited by examiner

*Primary Examiner*—Hoai V Ho  
(74) *Attorney, Agent, or Firm*—Snell & Wilmer L.L.P.

(57) ABSTRACT

Circuits for writing, reading, and erasing a programmable metallization cell are disclosed. The programming circuits compensate for parasitic capacitance and/or parasitic resistance. The parasitic resistance and/or capacitance is compensated for using a feedback loop or a time current filter. Various circuits also measure a switching speed of the programmable metallization cell.

5 Claims, 11 Drawing Sheets

PROGRAMMABLE MEMORY DEVICE CIRCUIT

CROSS REFERENCE TO RELATED APPLICATIONS

This application claims the benefit of U.S. Patent Application Ser. No. 60/732,218, entitled WRITE COMPENSATION TECHNIQUE FOR CURRENT PROGRAMMING OF PROGRAMMABLE METALLIZATION CELL DEVICES, filed Nov. 1, 2005; Ser. No. 60/732,217, entitled CONTINUOUS TIME CURRENT FILTER TECHNIQUE FOR PROGRAMMING OF PROGRAMMABLE METALLIZATION CELL DEVICES, filed Nov. 1, 2005; Ser. No. 60/732,216, entitled CURRENT FEEDBACK LOOP FOR ACCESS TRANSISTOR COMPENSATION IN PROGRAMMABLE METALLIZATION CELL RESISTANCE MEASUREMENT CIRCUITS, filed Nov. 1, 2005; and Ser. No. 60/732,298, entitled HIGH SPEED MEASUREMENT TECHNIQUE OF PROGRAMMABLE METALLIZATION CELL DEVICE, filed Nov. 1, 2005.

FIELD OF INVENTION

The present invention generally relates to programming circuits, and more particularly to circuits for programming programmable metallization cells.

BACKGROUND OF THE INVENTION

Memory devices are often used in electronic systems and computers to store information in the form of binary data. These memory devices may be characterized into various types, each type having associated with it various advantages and disadvantages.

Due, at least in part, to a rapidly growing numbers of compact, low-power portable computer systems and handheld appliances in which stored information changes regularly, low energy read/write semiconductor memories have become increasingly desirable and widespread. Furthermore, because these portable systems often require data storage when the power is turned off, non-volatile storage devices are desired for use in such systems.

Recently, programmable metallization cell (PMC) devices have been developed for use in such systems. PMC devices offer advantages over traditional memory devices because PMC devices can be formed using amorphous material and can thus be added to existing devices formed on a semiconductor substrate. The PMC devices also typically have lower production cost and can be formed using flexible fabrication techniques, which are easily adaptable to a variety of applications. Further, the PMC devices may be scaled to less than a few square microns in size, the active portion of the device being less than on micron. This provides a significant advantage over traditional semiconductor technologies in which each device and its associated interconnect can take up several tens of square microns.

FIG. 1 illustrates a typical PMC device 100 formed on a surface of a substrate 110. Device 100 includes electrodes 120 and 130, an ion conductor 140, and an electrode 180. Generally, device 100 is configured such that when a bias greater than a threshold voltage ($V_T$) is applied across electrodes 120 and 130, the electrical properties of structure 100 change. For example, as a voltage $V \geq V_T$ is applied across electrodes 120 and 130, conductive ions within ion conductor 140 begin to migrate and form a conductive region (e.g., electrodeposit 160) at or near the more negative of electrodes 120 and 130. As the electrodeposit forms, the resistance between electrodes 120 and 130 decreases, and other electrical properties may also change. If the same voltage is applied in reverse, the electrodeposit will dissolve back into the ion conductor and the device will return to its high resistance state.

Ion conductor 140 may include small nanostructures that are rich with metal, which are super ionic phases. The distance between these structures is typically very small, allowing the dendritic growth to occur rapidly. Therefore, it can be inferred that the speed of programming is generally dependent on the distance between the nanostructures.

Because PMC devices have advantages over traditional semiconductor memory devices and can be used in a wide variety of applications, improved circuits for reading, writing, and erasing PMC devices are desired.

SUMMARY OF THE INVENTION

The present invention provides improved circuits for use with programmable devices. More particularly, the invention provides programming circuits suitable for programming programmable metallization cell devices. Such circuits, including the corresponding programmable structures, can replace both traditional nonvolatile and volatile forms of memory.

The ways in which the present invention addresses various drawbacks of now-known circuits are discussed in greater detail below. However, in general, the present invention provides a programming circuit and a programmable device that are relatively robust and compensate for parasitic effects.

In accordance with one embodiment of the invention, a circuit includes a current monitoring loop to account for parasitic capacitance. In accordance with one aspect of this embodiment, the circuit includes a first current measurement device coupled to an anode of a programmable cell, a second current measurement device coupled to the cathode of the programmable cell, and a current compare device coupled to the first and second measurement devices. The measured currents are compared and a control signal is output to control the current forced by the programmer.

In accordance with another embodiment of the invention, a circuit includes a continuous time current filtering circuit to generate programming current for the programmable cell.

In accordance with yet another embodiment of the invention, a circuit includes a current feedback loop to compensate for parasitic resistance in the circuit.

And, in accordance with yet another embodiment of the invention, a circuit for measuring switching speeds of a programmable device is provided.

BRIEF DESCRIPTION OF THE DRAWING FIGURES

Skilled artisans will appreciate that elements in the figures are illustrated for simplicity and clarity and have not necessarily been drawn to scale. The dimensions of some of the elements in the figures may be exaggerated relative to other elements to help to improve understanding of embodiments of the present invention.

DETAILED DESCRIPTION

The present invention provides circuits for programming programmable metallization cells. As explained in greater detail below, the programmable cells may suitably be arrayed in either a common anode or common cathode configuration. A more detailed description of programmable cells including a common anode and common cathode configurations are set forth in U.S. Pat. No. 6,635,914, issued to Kozicki et al., entitled MICROELECTRONIC PROGRAMMABLE DEVICE AND METHODS OF FORMING AND PROGRAMMING THE SAME, the contents of which are hereby incorporated herein by reference.

Figure 1:
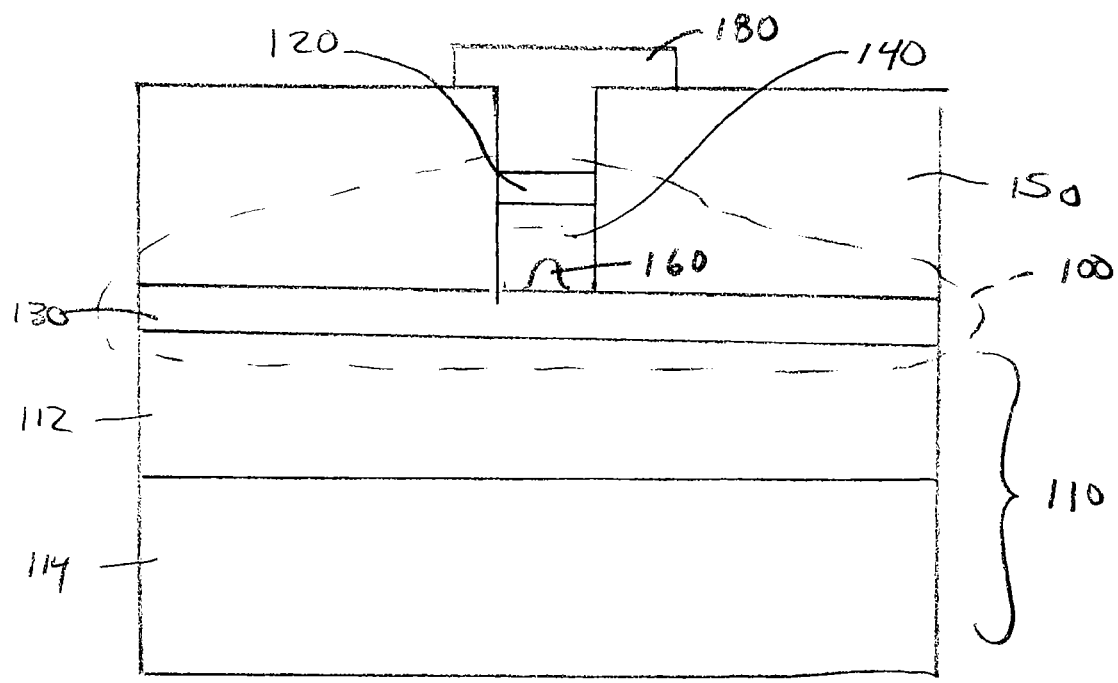
FIG. 1 illustrates a programmable metallization cell as known in the art.
Figure 2:
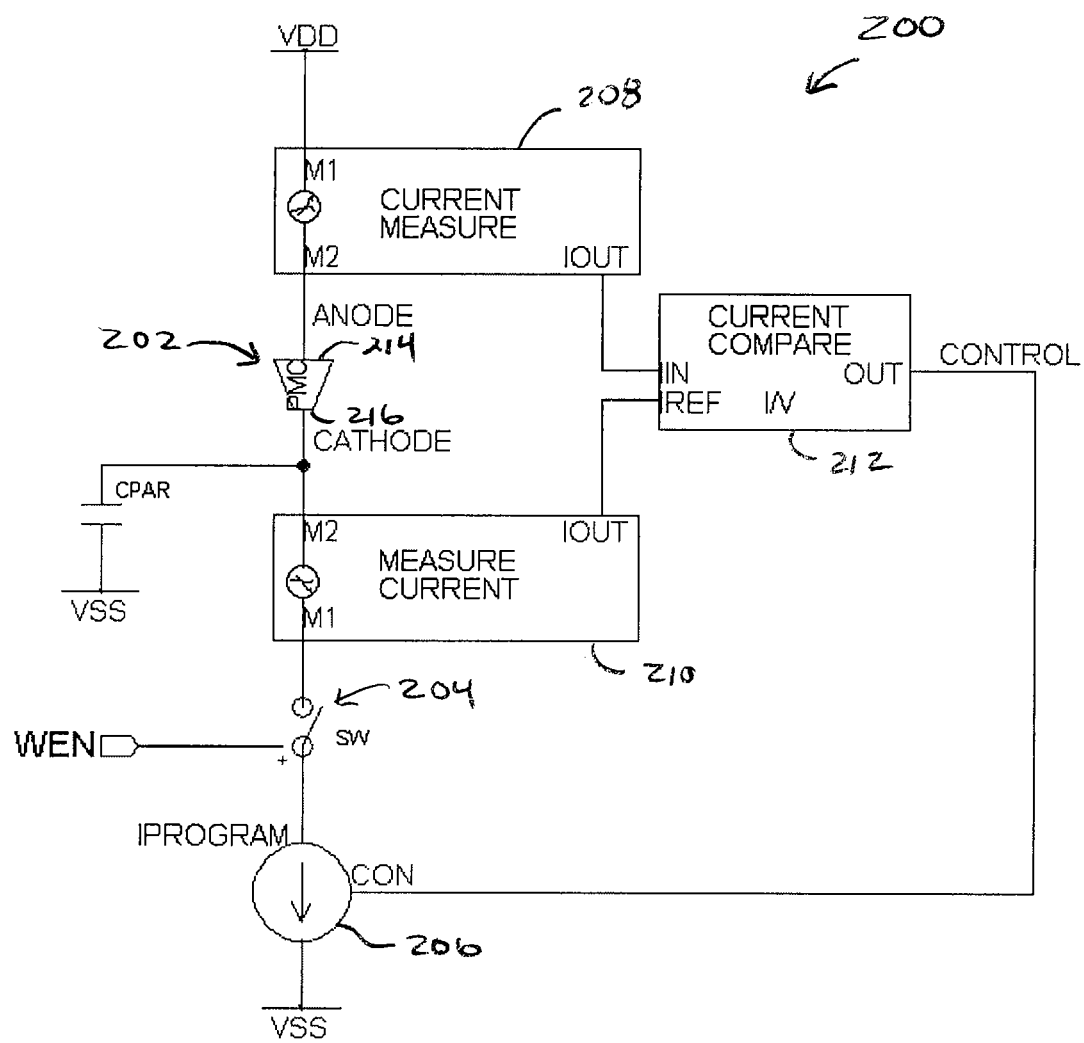
FIGS. 2-3 illustrate a programming circuit, including a current monitoring loop to compensate for parasitic capacitance, in accordance with various embodiments of the invention.

FIG. 2 illustrates a circuit 200, including parasitic capacitance CPAR for programming an array of programmable metallization cells 202, such as device 100 set forth in FIG. 1, using a constant current pulse. Using a current pulse to program cells 202 may be desirable for a variety of reasons—for example, relatively simple circuits can be used to program cells 202 using current pulse techniques. However, certain issues may arise when using a current pulse to program cells 202. For example, when a current pulse is applied to device 100, the voltage drop across device 100 increases rapidly due to the very high off resistance of the device (the resistance of ion conductor 140) until the threshold is reached and the device resistance begins to drop due to conductive region 160 (dendrite) growth. Device 100 eventually limits the voltage across itself to the threshold voltage and the current source limits the current, causing the resistance to be equal to the threshold voltage divided by the programming current. In slow devices, however, the distance between the super ionic phases is longer and the dendrites will not grow fast enough to limit the increased voltage drop induced by the programmer. If there is parasitic capacitance in the system, which is the case when the device is in an array, the current pulse will charge the capacitor up to the voltage limit of the system, or take charge off of the capacitor, and the extra charge will be dumped into the device 100 once the resistance of device 100 begins to drop, causing a transient excess current to reduce the resistance of the device below the expected value.

Circuit 200 includes a feedback loop to reduce the effects of any over-programming in a current pulse programming circuit. Circuit 200 includes a supply voltage Vdd, a low supply voltage Vss, a switch 204, a current program sources 206, a first current measurement device 208, a second current measurement device 210, and a current comparator 212. In the illustrated embodiment, an anode 214 of cell 202 is shown as the low impedance voltage source while a cathode 216 is connected to the high impedance current source. If the current direction is changed, cell 202 terminals would be switched as well.

Operation of circuit 200 begins with a write enable. A write enable signal (WEN) causes current to flow through cathode current measurement device 210 and begins to pull charge off the parasitic capacitor CPAR. Anode current measurement device 208 measures no current. The current measured at the anode and cathode is compared by current compare device 212, which outputs a voltage or current to reduce the current forced by a programmer. The voltage at cathode 216 begins to decrease slower so that the capacitor cannot supply extra charge. The resistance of cell 202 begins to drop and the current in anode device 208 begins to rise. Current comparator 212 then outputs the appropriate signal to increase the programming current until it reaches the current level set by the programmer. The control loop can be implemented to allow current to flow at the cathode side and the then limit the current when it starts to flow at the anode side to insure current flow. The only constraint is that the currents at the anode and cathode be about equal to the programming current.

Figure 3:
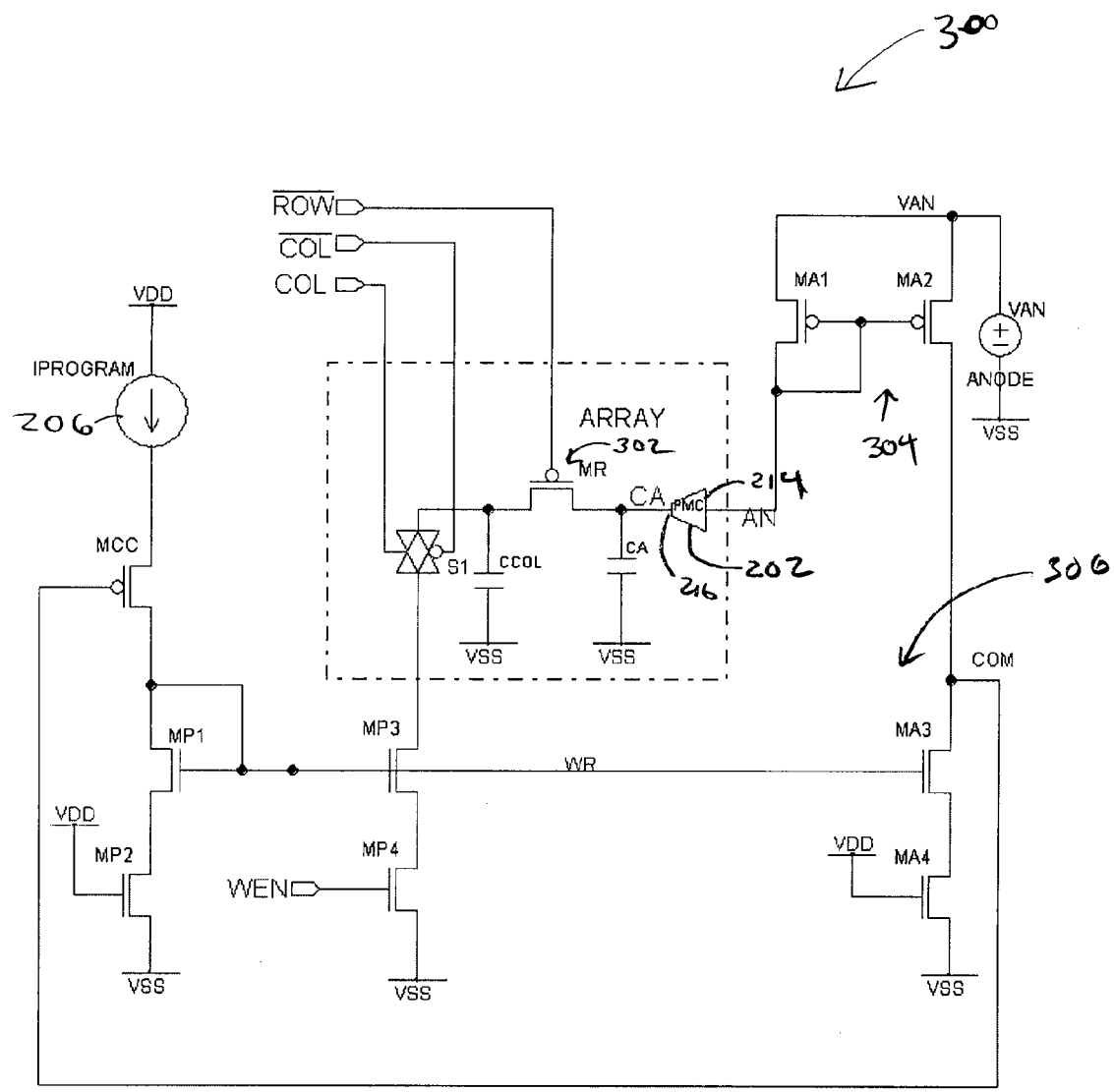

FIG. 3 illustrates circuit 300, for use as circuit 200 in greater detail. Those skilled in the art appreciate that circuit 200 is not limited to the specific example illustrated in FIG. 3.

Circuit 300 includes a transistor 302 to isolate rows of cells 202 and CMOS switch S1 to selectively isolate each column. In the illustrated embodiment, anode 214 of cells 202 is common and shares a common current mirror 304. The programming current measurement is performed by current mirror 306, having transistors MP3 and MA3. Common current mirror 306 performs the anode current measurement. Current source 206 and transistor MP1 function as the programmer. Transistor MCC controls the programming current supplied by the programmer.

In operation, cell 202 to be programmed is selected with the row and column control signals. When write enable toggles high and MP4 turns on, current flows through MP3—dependent of the state of the programmer. When cell 202 is unprogrammed, no current flows through MA1 and MA2 and the control voltage pulls low, allowing the programming current to flow through MP1 and be mirrored through MP3 and MA3. As the device begins to turn on, the current flow in the anode increases and the control voltage pulls high, starving MP1 of current and causing the voltage drop across cell 202 to decrease. The current then stabilizes, so that the anode current is about equal to the cathode current and cell 202 limits the voltage to the write threshold voltage of the cell. The stabilized current is about equal to the programming current which would maintain an effective constant programming current seen by cell 202, allowing a controlled program resistance directly proportional to the programming current.

Figure 4:
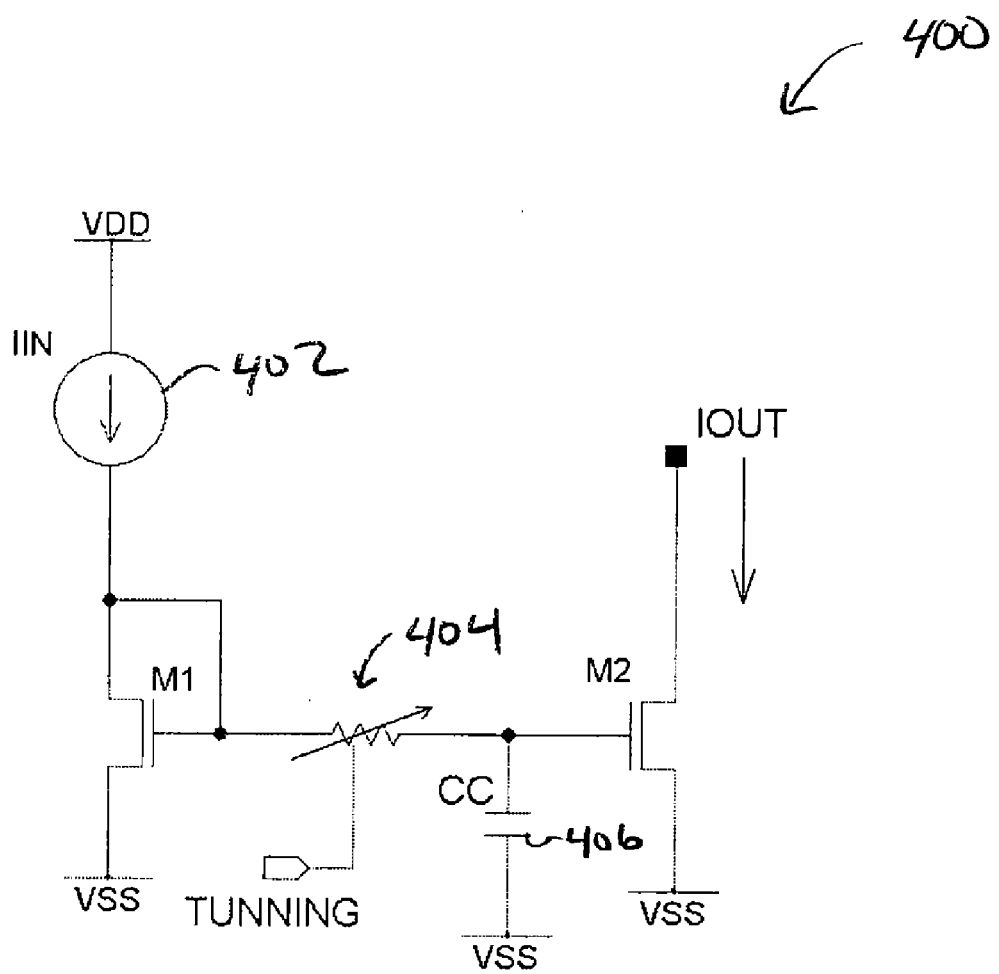
FIGS. 4-6 illustrate time current filter circuits in accordance with various embodiments of the invention.
Figure 5:
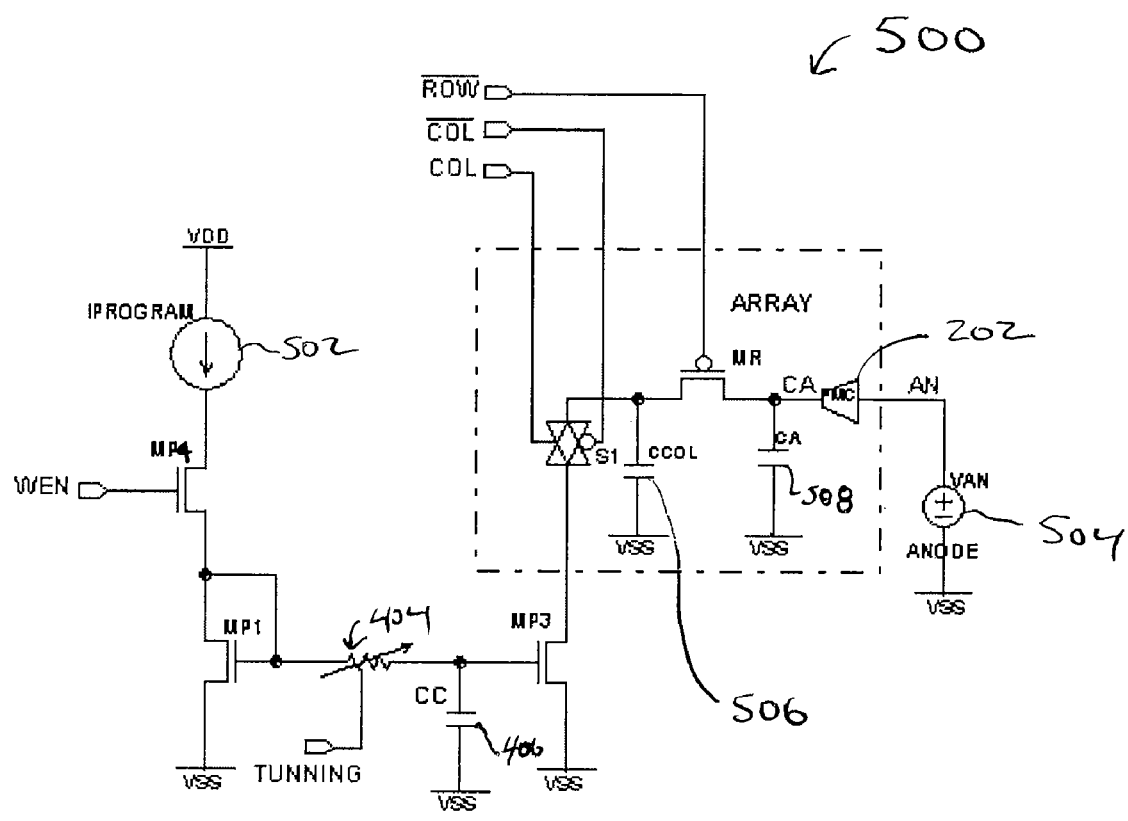
Figure 6:
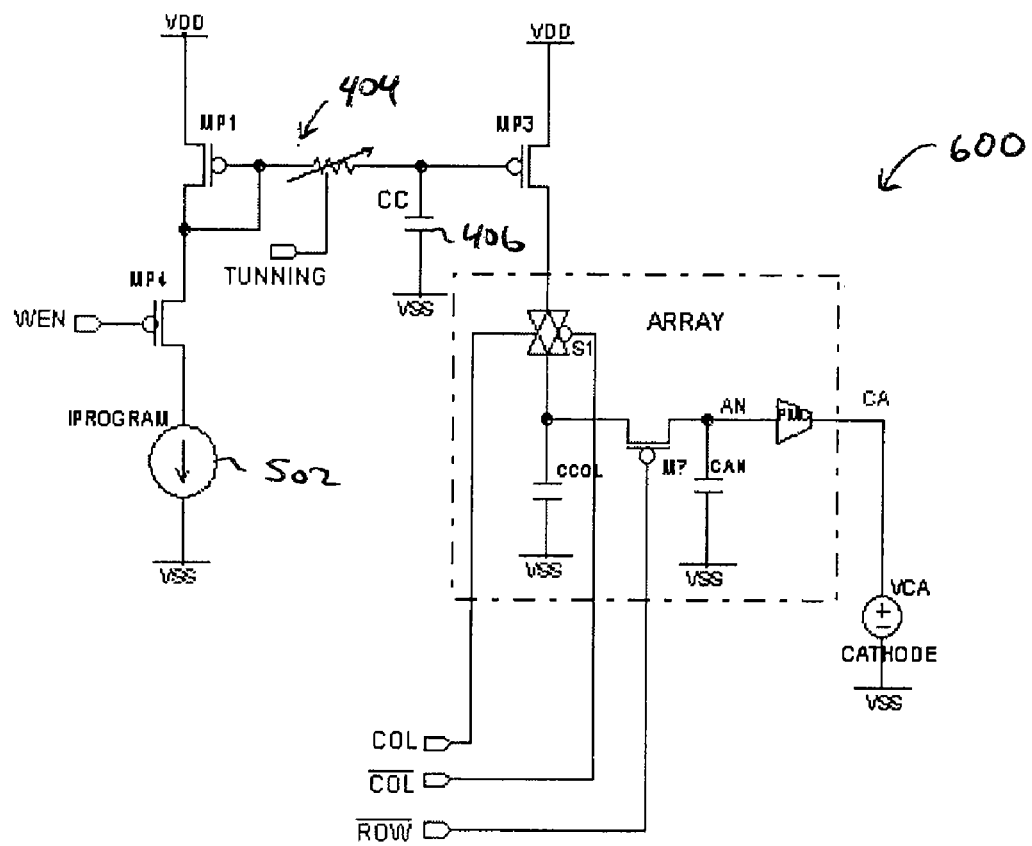

FIGS. 4-6 illustrate additional circuits to reduce the effects of any over programming of programmable metallization cells due to, for example parasitic capacitance in the circuit. FIG. 4 illustrates a continuous time current filtering circuit 400 for use with various embodiments of the invention and FIGS. 5 and 6 illustrate programming circuits 500 and 600, for respectfully programming common anode and common cathode arrays of programmable cells.

As illustrated in FIG. 4, circuit 400 includes a supply voltage Vdd, a low supply voltage Vss, an input current source 402, a first transistor M1, a second transistor M2, a variable resistor 404, and a capacitor 406. Circuit 400 is generally configured to reduce the rise time of the programming current pulse to match the speed of resistance reduction of a programmable metallization cell.

In operation, the input current is converted to a voltage by a diode connected device M1. This voltage is then feed to M2 which mirrors the input current. Voltage from device M1 is lowpass filtered by variable resistor 404 and capacitor 406. The rise time of this voltage is directly proportional to the rise time of the current IOUT and is controlled by the RC time constant of variable resistor 404 and capacitor 406. Resistor 404 or capacitor 406 can be tuned or varied, so that the rise time of the current pulse allows resistance across a cell to drop and limit the voltage drop across itself so that over programming does not occur.

FIG. 5 illustrates a circuit 500, for mitigating effects of parasitic capacitance for an array of cells 202 in a common anode configuration. Circuit 500 includes a program current source 502, transistors MP1, MP3, MP4, tunable resistor 404, capacitor 406, capacitance associated with a column in the array 506, a row selection transistor MR, a switch SI, and anode voltage source 504, and a capacitance 508.

When programming is enabled, current flows in transistor MP1 through the enabled transistor MP4. Transistor MP1 converts the programming current to a voltage which is filtered, or the rise time is increased, which causes the voltage at MP3 to rise slowly, which in turn causes the programming current produced by MP3 to be ramped in a quasi linear fashion depending on the change in voltage on MP1. The charge on column capacitance 506 is slowly reduced and the voltage across cell 202 is slowly dropped, so that excess charge from capacitance 506 is not passed through cell 202.

Circuit 600 is similar to circuit 500, except cells 202 of circuit 600 are arrayed in a common cathode configuration and a polarity of cell 202 and direction of program current source are reversed.

The tuning element in exemplary circuits 400, 500, and 600 is illustrated as a variable resistor 404; however, a variable capacitor, resistor bank, or capacitor bank could alternatively be used in place of resistor 404. The tuning can be calibrated manually or with an auto tuning scheme. In either case, the tuning is accomplished by starting the resistor or capacitor at the lowest value and programming the device. A careful measurement of the resistance would then take place. If the resistance is not equal to the threshold voltage of the device divided by the programming current, the resistor and capacitor values would be increased and the process would continue until the resistance of cell 202 was about equal to the threshold voltage divided by the programming current.

Figure 7:
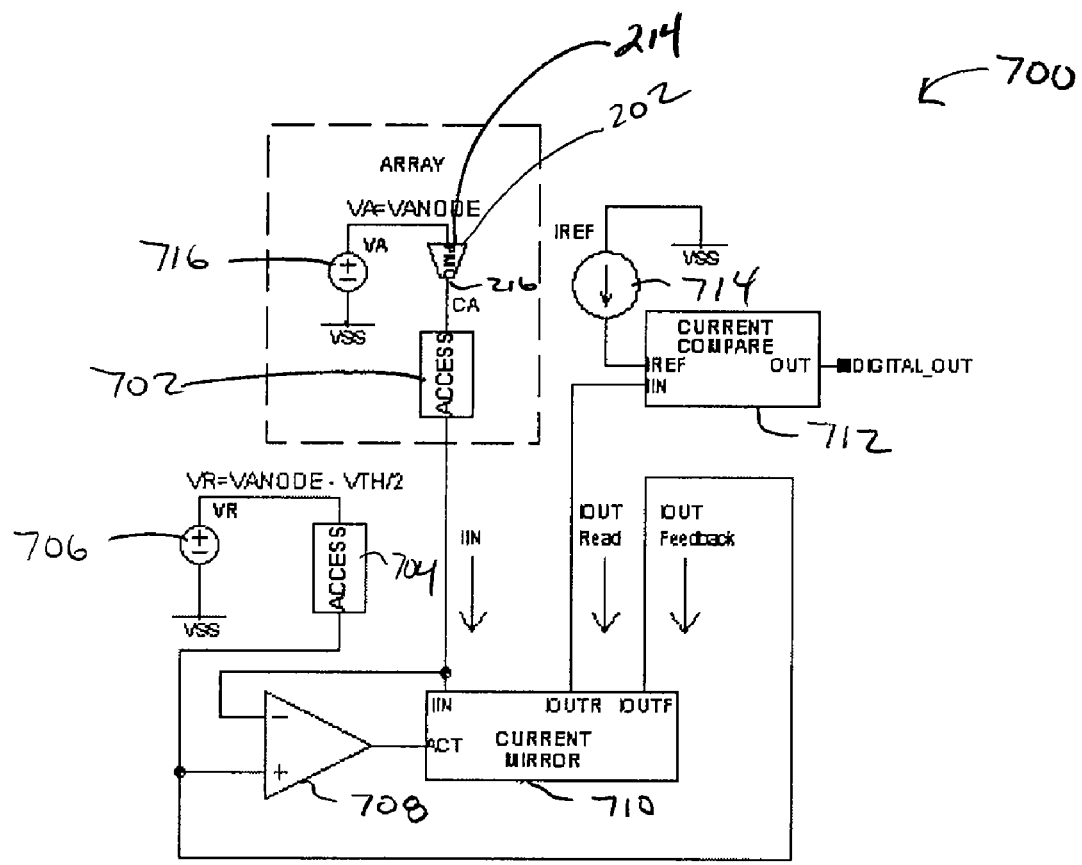
FIGS. 7-9 illustrate circuits, including a current feedback loop to compensate for parasitic resistance, in accordance with various embodiments of the invention.
Figure 8:
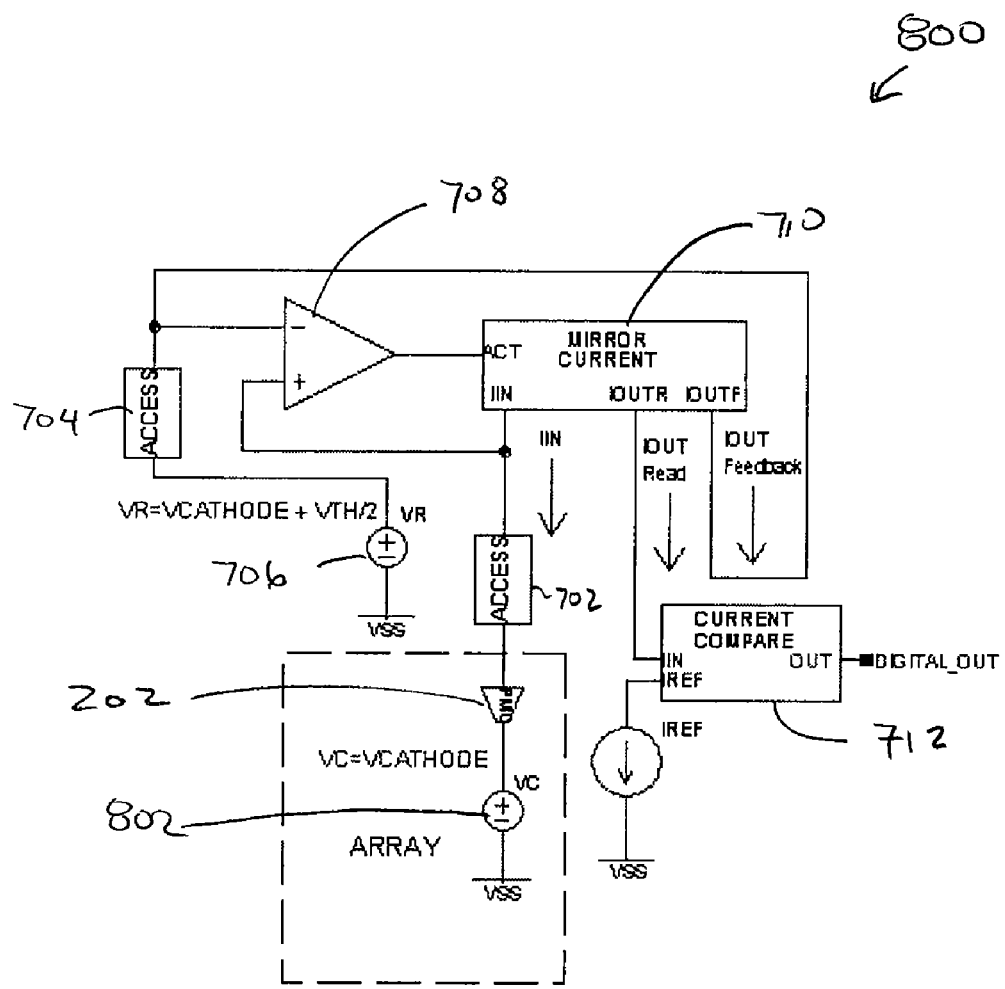
Figure 9:
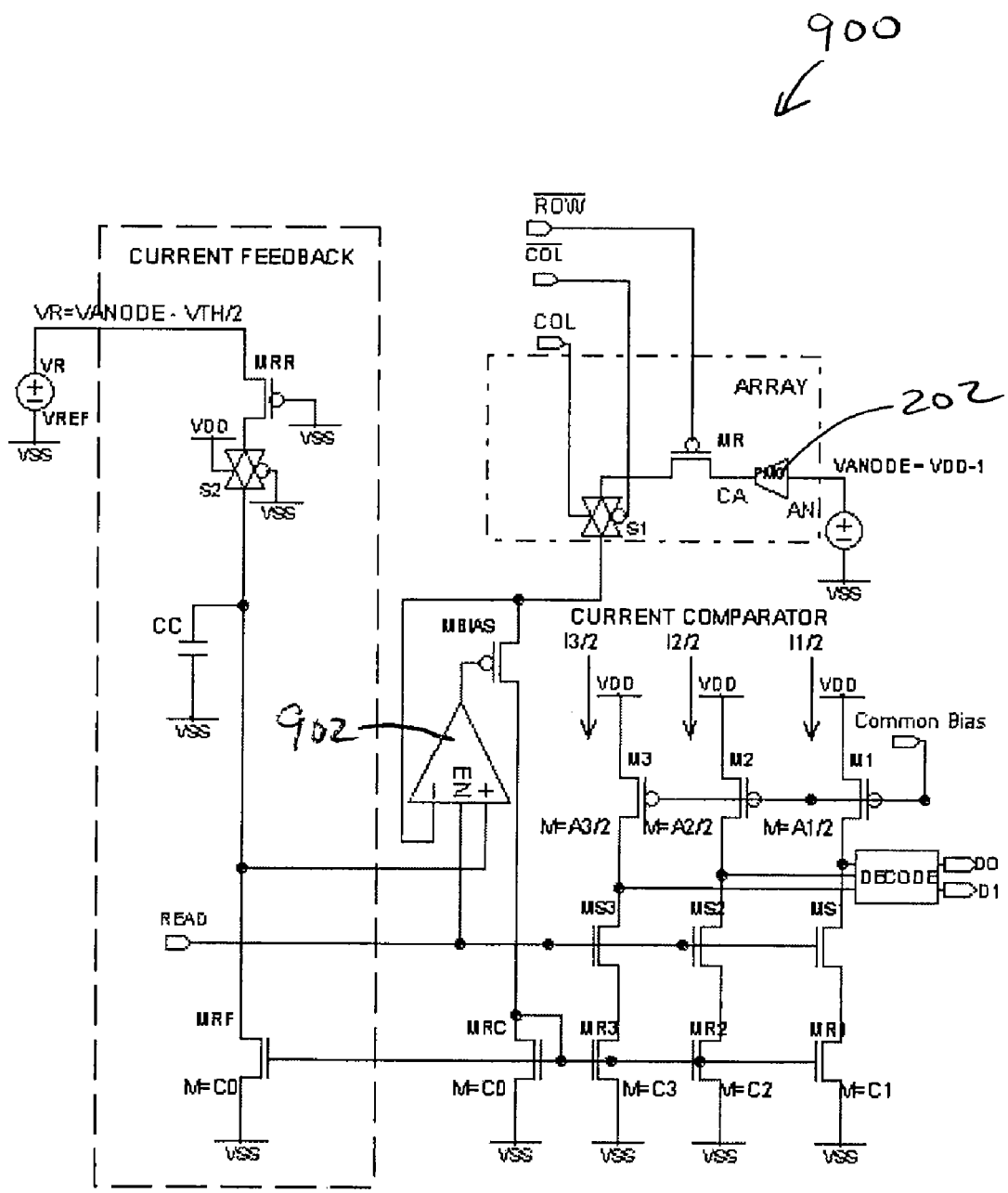

FIGS. 7-9 illustrate additional circuits to compensate for parasitic resistance in a programming circuit in accordance with additional embodiments of the invention. As noted above, when programmable devices are being accessed individually in an array, isolation devices are often employed to avoid resistive paths between devices. The isolation devices, however, can have an on resistance close in magnitude or even larger than the programmed resistance of the PMC device. This can be detrimental when the resistance of the PMC device is being measured with a forced bias, since the majority of the voltage drop could be across the access elements. To compensate this parasitic resistance, a current feedback loop is used in the resistance measurement circuit, as illustrated in FIGS. 7-9.

When a bias is forced across cell 202 in the array, the bias is actually forced across cell 202 and an associated access element. Cell 202, which has been erased, has an off resistance of about $10^8$ to about $10^{12}$ ohms, so the majority of the voltage drop is across cell 202 and the currents sensed are in the sub nanoampere range. When cell 202 is programmed, however, the resistance can be from about 100 to about $10^6$ ohms, depending on the programming conditions. Normally, the accesses device size is minimized which leads to large on resistances that can vary from about 1 k to about 50 k ohms, depending on the device used. Cell 202 resistance can be quite stable and predictable, but the access device resistance is usually very nonlinear and dependant on the operation conditions and process variations. Therefore, there can be several cases where the majority of the measurement bias is across the access device and cell 202—which would result in a loss of signal current and ultimately errors in the measurement.

FIG. 7 illustrates a circuit 700 to compensate for the access device resistance. Circuit 700 includes cell 202, an access element 702, a replicated access element 704, a reference voltage 706, an amplifier 708, a current mirror 710, a current comparator 712, a current reference 714, and an anode voltage reference 716.

In the illustrated embodiment, cells 202 are arrayed in a common anode configuration. Although access elements 702, 704 are illustrated as coupled to a cathode 216 of device 202, elements 702, 704 could alternatively be coupled to anode 214 of device 202. As illustrated, access element 702 is replicated at the output of the reference voltage 706. In accordance with one aspect of this embodiment, amplifier 708 is an operational amplifier; however, amplifier 708 is not limited to a specific form of amplifier. When device 202 is accessed, amplifier 708 forces reference voltage 706 across selected device 202 and access device 702. This current is then fed back to the reference through current mirror 710 which forces the reference to source this current. The sourced current causes a voltage drop across the replicated access device that drops the reference voltage the op amp is forcing across cell 202 in the array. This will continue until the voltage at the cathode of cell 202 is equal to reference voltage 706. The voltage across cell 202 will then be about equal to the difference between anode voltage 716 and reference voltage 706, which should be controlled and set at about $V_{th}/2$. The current generated by having $V_{th}/2$ across the device is also mirrored and compared to a reference current 714 for measurement which is shown here as a digital output, but could also be a analog output such as a current to voltage converter.

A common cathode approach circuit 800, depicted in FIG. 8, operates on the same principle, except the current is forced by the current mirror instead of sunk. Also, the anode voltage of cell 202 is matched to reference voltage 706 instead of a cathode voltage 802.

A number of technologies could be used to implement the functions described in connection with the circuits illustrated in FIGS. 7 and 8. FIG. 9 illustrates a MOS implementation in a multi-level read memory circuit 900.

In the illustrated embodiment, a row access device is depicted by PMOS device MR. The columns are isolated by CMOS switches S1. These devices are replicated in the current feedback path by devices MRR and S2. AN amplifier 902 and transistor MBIAS force the reference voltage across S1, MR and cell 202. This current is then fed back by the current mirror formed by transistors MRC and MRF. This current causes the reference voltage at the op amp to drop because of the voltage drop across MRR and S2 induced by the current and the voltage across the PMC element increase until it approximately matches the anode voltage minus the reference voltage. A capacitor CC is used to improve the loop stability, so that the reference does not over compensate—causing a larger than expected voltage drop across cell 202. The current is also mirrored to MR3, MR2, and MR1 for current comparison. The compared values are then decoded to output the appropriate digital values.

Figure 10:
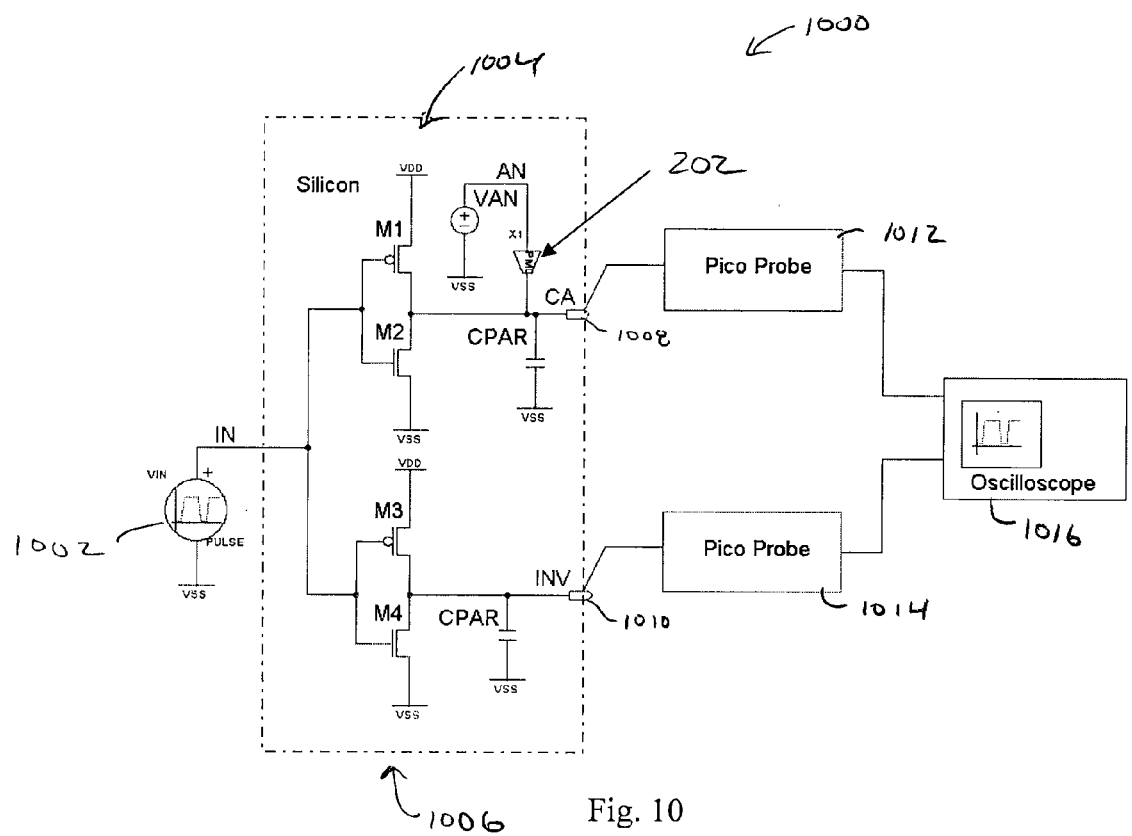
FIGS. 10-11 illustrate a circuit for measuring switching speed and a corresponding output curve in accordance with further embodiments of the invention.

In several instances, it is desirable to measure a switching speed of a programmable cell. Unfortunately, measuring the switching speed of programmable metallization cells can be difficult due to parasitic capacitances. FIG. 10 illustrates a circuit to reduce parasitic capacitance of the measurement system and allow for a direct calculation of the write time, erase time, and the write threshold voltage from an oscilloscope plot.

In the illustrated embodiment, to simplify the measurement set-up, the number of circuit elements is minimized to reduce parasitic capacitance and decrease a number of variables for matching simulation models. Exemplary circuit 1000 includes an input 1002 to inverters 1004, 1006. Input 1002 is driven by a high speed pulse generator terminated according to the equipment's specifications. Cell 202 is programmed and erased by an inverter 1004 formed by transistors M1 and M2. When the input voltage is low, transistor M1 pulls the cathode voltage up to the supply voltage, VDD, which is twice the voltage on the anode, and cell 202 is reversed biased which causes the device to erase and the resistance of the device to rise dramatically. When the input voltage drops low, the cathode voltage is pulled down to ground and a positive voltage is forced across the PMC element which causes the device to program. An inverter 1006 formed by transistors M3 and M4 is used to cancel the delay due to the programming inverter. The capacitance seen by the outputs of the two inverters is matched as close as possible through device layout. The inverters and cell 202 are all manufactured on a silicon substrate Small probe pads 1008, 1010 are placed at the output of each inverter to again minimize capacitance at the output and Pico Probes 1012, 1014, low capacitance probes for measuring high-speed signals, are used to measure the output waveforms. The two signals are then captured with a high-speed oscilloscope 1016 and the switching characteristics are deduced from the plots.

Figure 11:
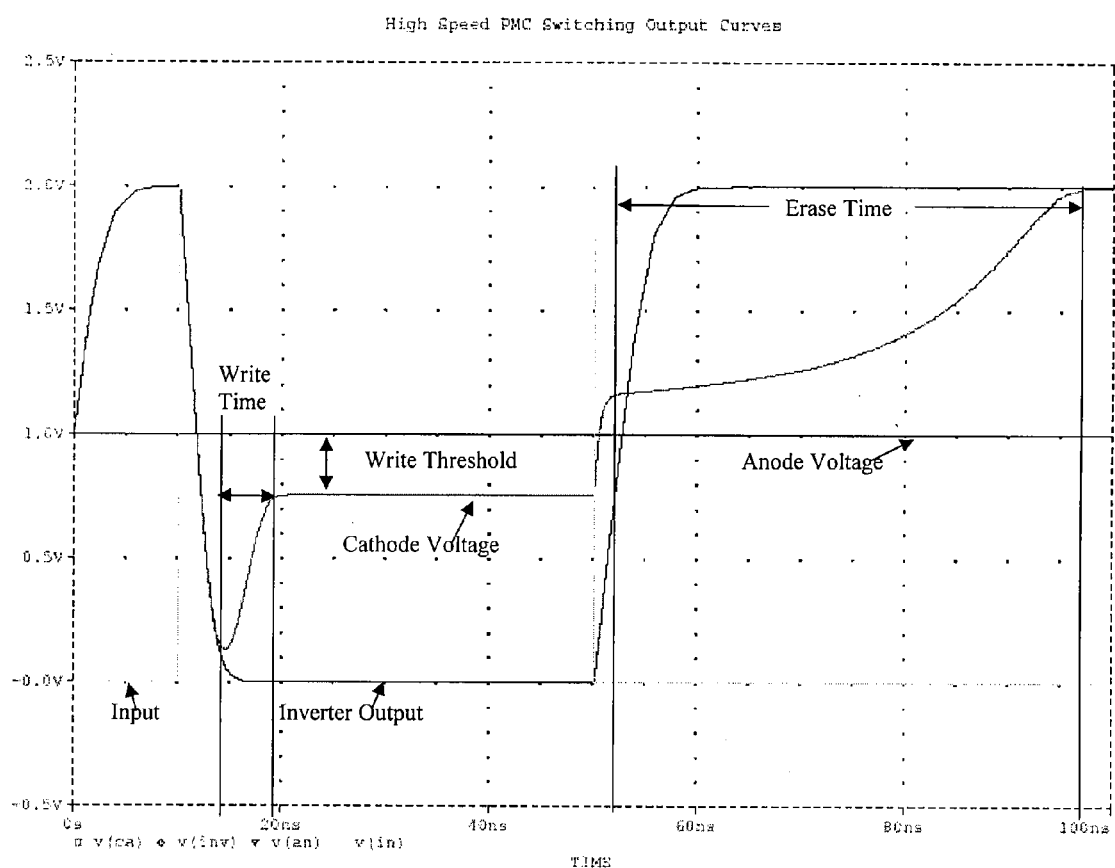

A typical oscilloscope output, showing the input to the inverters, the output of the inverters, and the anode voltage is illustrated in FIG. 11. In this example, the device (e.g., device 100) begins in an off state at time zero and is written at time 10 ns. When erased, the outputs of the both inverters are equal. As the device begins to turn on, its decreasing resistance causes the output of the programming inverter to rise up to the anode voltage until the current limit of the transistor M2 has been reached. At this point, cell 202 limits the voltage drop across itself to the write threshold. The programming duration is the difference between the times at which the write threshold voltage is reached and the point where the inverter outputs deviate. This takes into account the charge of the parasitic capacitor. If this capacitor is neglected, the write time would start at the point when the voltage across cell 202 is equal to the write threshold. The erase begins when the polarity of the input voltage changes direction and a negative bias is forced across the PMC element. As the device resistance increases, the programming transistor M1 begins to dominate and pulls the output of the cathode voltage to the supply voltage to again equal the output of the reference inverter. The deviation time of the two signals constitutes the erase time.

Although the present invention is set forth herein in the context of the appended drawing figures, it should be appreciated that the invention is not limited to the specific form shown. Various modifications, variations, and enhancements in the design and arrangement of the method and apparatus set forth herein, may be made without departing from the spirit and scope of the present invention as set forth in the appended claims.

I claim:

1. A method for compensating a resistance of access elements in an array of programmable variable resistance cells to force a reference bias across the programmable variable resistance cells, said method comprising:
   replicating an access element from the array of programmable variable resistance cells to form a replicated element and coupling the replicated element to a voltage reference;
   forcing the voltage reference across an access element and a programmable variable resistance cell;
   measuring a produced current from the programmable variable resistance cell;
   mirroring said produced current to form an added voltage drop to the reference voltage; and
   forcing the reference voltage and added voltage drop across the access element and the programmable variable resistance cell.

2. A circuit for compensating a resistance of access elements in an array of programmable variable resistance cells to force a reference bias across the programmable variable resistance comprising:
   an array of programmable variable resistance cells, each cell having an anode and a cathode, wherein said array of programmable variable resistance is coupled together with a common anode;
   an isolation switch coupled to at least one cathode;
   a reference voltage coupled to an amplifier through replicated isolation switches;
   a transconductance device coupled to the amplifier by a voltage input, wherein the transconductance device current output is coupled to a programmable variable resistance cell through the isolation switch; and
   a current mirror with an input coupled to said transconductance device current output and an output coupled to the replicated isolation switches and to the input of said amplifier.

3. The circuit of claim 2, wherein said array of programmable variable resistance cells includes a plurality of elements coupled together with a common cathode.

4. The circuit of claim 2, wherein said current mirror comprises a transistor.

5. The circuit of claim 2, wherein a compensation capacitor is coupled to said amplifier.

* * * * *